(12) United States Patent
Li

(10) Patent No.: US 10,304,389 B2
(45) Date of Patent: May 28, 2019

(54) OLED PIXEL DRIVING CIRCUIT AND OLED DISPLAY DEVICE

(71) Applicant: Shenzhen China Star Optoelectronics Technology Co., Ltd., Shenzhen, Guangdong (CN)

(72) Inventor: Guang Li, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 168 days.

(21) Appl. No.: 15/536,863

(22) PCT Filed: May 17, 2017

(86) PCT No.: PCT/CN2017/084679
§ 371 (c)(1),
(2) Date: Jun. 16, 2017

(87) PCT Pub. No.: WO2018/188149
PCT Pub. Date: Oct. 18, 2018

(65) Prior Publication Data
US 2019/0096334 A1    Mar. 28, 2019

(30) Foreign Application Priority Data

Apr. 10, 2017   (CN) .......................... 2017 1 0229052

(51) Int. Cl.
*G09G 3/3275* (2016.01)
*H01L 27/32* (2006.01)

(52) U.S. Cl.
CPC ....... *G09G 3/3275* (2013.01); *H01L 27/3262* (2013.01); *H01L 27/3265* (2013.01);
(Continued)

(58) Field of Classification Search
CPC ......... G09G 3/3275; G09G 2320/0626; G09G 2310/0264; G09G 2320/0233; H01L 27/3262; H01L 27/3265
See application file for complete search history.

(56) References Cited

U.S. PATENT DOCUMENTS 6,229,506 B1   5/2001  Dawson et al.
8,797,314 B2   8/2014  Chung et al.
(Continued)

FOREIGN PATENT DOCUMENTS

| CN | 102654973 A | 9/2012 |
| CN | 102842283 A | 12/2012 |
| CN | 104409042 A | 3/2015 |

*Primary Examiner* — Abbas I Abdulselam
(74) *Attorney, Agent, or Firm* — Andrew C. Cheng

(57) ABSTRACT

An OLED pixel driving circuit and an OLED display device. The OLED pixel driving circuit includes a first switching element, second switching element, a third switching element, a fourth switching element, a fifth switching element, a first capacitor, a second capacitor and an OLED. The signals received by the OLED pixel driving circuit include a data signal formed by reference voltage and data voltage. When lighting the organic electroluminescent device (OLED), a current flowing through the second switching element is proportional to a square of a difference between the data voltage and a reference voltage in the data signal. Through the above method, the present invention can increase the display quality of the OLED.

19 Claims, 3 Drawing Sheets

(52) U.S. Cl.
CPC ............ *G09G 2310/0264* (2013.01); *G09G 2320/0233* (2013.01); *G09G 2320/0626* (2013.01)

(56) References Cited

U.S. PATENT DOCUMENTS

| | | |
|---|---|---|
| 2004/0145547 A1 | 7/2004 | Oh |
| 2008/0036710 A1 | 2/2008 | Kim |
| 2008/0122381 A1 | 5/2008 | Jung |
| 2012/0013597 A1 | 1/2012 | Han |
| 2015/0356916 A1 | 12/2015 | Qian |
| 2015/0371590 A1* | 12/2015 | Jeong .................. G09G 3/3291 345/213 |

* cited by examiner

OLED PIXEL DRIVING CIRCUIT AND OLED DISPLAY DEVICE

BACKGROUND OF THE INVENTION

1. Field of the Invention

The present invention relates to a display technology field, and more particularly to an OLED pixel driving circuit and OLED display device.

2. Description of Related Art

An organic electroluminescent device (OLED) has many excellent features such as wide color gamut, high contrast and being a solid state device so that the OLED is more and more competitive in the display technology field.

Currently, the OLED display device basically adopts an active driving method. Because the OLED is a current-type device, how to precisely control the current is an important content that should be considered. As shown in FIG. 1, and FIG. 1 is a schematic circuit diagram of a 2T1C pixel driving circuit applied in an OLED according to an embodiment of the conventional art. The pixel driving circuit includes a first thin-film transistor T1, a driving thin-film transistor T2 and a storage capacitor Cst. In the OLED emitting stage, a current flowing through the OLED is controlled by the driving thin-film transistor T2, and the value of the current is: IOLED=k(Vgs−Vth)2, wherein, k is a current amplification coefficient of the driving thin-film transistor T2, Vth is a threshold voltage of the second switching element T2. Vgs is a voltage difference of the gate electrode and the source electrode of the driving thin-film transistor. In the pixel driving circuit shown in FIG. 1, Vgs=VDD−Vdate.

In a long-term research, the inventor of the present invention finds that the 2T1C pixel driving circuit applied in the OLED exists following problems: (1) the Vth of the driving thin-film transistor T2 is easily to drift; (2) a voltage drop phenomenon of the power source voltage VDD is existed. The above two aspects will cause a variation of the OLED driving current such that the OLED display panel will occur an uneven display brightness so as to affect the display image.

SUMMARY OF THE INVENTION

The technology problem mainly solved by the present invention is providing an OLED pixel driving circuit and an OLED display device, which can increase the display quality of the OLED.

In order to solve the above technology problem, a technology solution adopted by the present invention is: providing an OLED pixel driving circuit, comprising: a first switching element, a control terminal of the first switching element receives a first type of scanning signal (gn) of a present stage, a first channel terminal of the first switching element receives a data signal (Data), wherein, the data signal is a pulse signal formed by a reference voltage and a data voltage; a second switching element, a control terminal of the second switching element is connected with a second channel terminal of the first switching element through a first capacitor, a first channel terminal receives a power source voltage (VDD), wherein, a connection location between the second channel terminal of the first switching element and the first capacitor is defined as a first node, a connection location between the control terminal of the second switching element and the first capacitor is defined as a second node, and the power source voltage further connects to the second node through a second capacitor; a third switching element, a control terminal of the third switching element receives a lighting control signal (EM2), a first channel terminal of the third switching element is connected with a second channel terminal of the second switching element, a second channel terminal of the third switching element is connected to an organic electroluminescent device (OLED), wherein, a connection portion between the second channel terminal 23 of the second switching element and the first channel terminal of the third switching element is defined as a third node; a fourth switching element, a control terminal of the fourth switching element receives a second type of scanning signal of the present stage, a first channel terminal of the fourth switching element is connected to the third node, and a second channel terminal of the fourth switching element is connected to the second node; a fifth switching element, a control terminal of the fifth switching node receives a second type of scanning signal of the previous stage, a first channel terminal of the fifth switching node is connected with the second node, a second channel terminal of the fifth switching element receives a discharging voltage when the fifth switching element M5 is turned on; wherein, the first switching element, the second switching element, the third switching element, the fourth switching element, and the fifth switching element are all PMOS transistors; each of the second type of scanning signal of the previous stage, the second type of scanning signal of the present stage, the first type of scanning signal of the present stage and the lighting control signal is a timing pulse signal; wherein, a pulse of the second type of scanning signal of the previous stage is earlier than the second type of scanning signal of the present stage, a starting moment of a pulse of the first type of the scanning signal of the present stage is the same as a starting moment of the pulse of the second type of the scanning signal of the previously stage, an end moment of the pulse of the first scanning signal of the present stage is later then an end moment of the pulse of the second type of scanning signal of the present stage; an starting moment of a pulse corresponding to the data voltage in the data signal is not earlier than an end moment of the pulse of the second type of scanning signal, and is earlier an end moment of the pulse of the first type of scanning signal of the present stage; an end moment of the pulse corresponding to the data voltage in the data signal is later than the end moment of the pulse of the first type of scanning signal of the present stage; a starting moment of the pulse of the lighting control signal is not later than the start moment of the second type of the scanning signal of the previous stage, and an end moment of the pulse of the lighting control signal is not earlier than the end moment of the pulse corresponding to the data voltage in the data signal; and wherein, when lighting the organic electroluminescent device (OLED), a current flowing through the second switching element is proportional to a square of a difference between the data voltage and a reference voltage in the data signal.

In order to solve the above technology problem, another technology solution adopted by the present invention is: an OLED pixel driving circuit, comprising: a first switching element, a control terminal of the first switching element receives a first type of scanning signal (gn) of a present stage, a first channel terminal of the first switching element receives a data signal (Data), wherein, the data signal is a pulse signal formed by a reference voltage and a data voltage; a second switching element, a control terminal of the second switching element is connected with a second channel terminal of the first switching element through a first capacitor, a first channel terminal receives a power source voltage (VDD), wherein, a connection location between the second channel terminal of the first switching element and the first capacitor is defined as a first node, a connection location between the control terminal of the second switching element and the first capacitor is defined as a second node, and the power source voltage further connects to the second node through a second capacitor; a third switching element, a control terminal of the third switching element receives a lighting control signal (EM2), a first channel terminal of the third switching element is connected with a second channel terminal of the second switching element, a second channel terminal of the third switching element is connected to an organic electroluminescent device (OLED), wherein, a connection portion between the second channel terminal 23 of the second switching element and the first channel terminal of the third switching element is defined as a third node; a fourth switching element, a control terminal of the fourth switching element receives a second type of scanning signal of the present stage, a first channel terminal of the fourth switching element is connected to the third node, and a second channel terminal of the fourth switching element is connected to the second node; a fifth switching element, a control terminal of the fifth switching node receives a second type of scanning signal of the previous stage, a first channel terminal of the fifth switching node is connected with the second node, a second channel terminal of the fifth switching element receives a discharging voltage when the fifth switching element M5 is turned on; wherein, when lighting the organic electroluminescent device (OLED), a current flowing through the second switching element is proportional to a square of a difference between the data voltage and a reference voltage in the data signal.

In order to solve the above technology problem, another technology solution adopted by the present invention is: providing an OLED display device including multiple OLED pixel unit arranged as a matrix, wherein, each OLED pixel unit includes a corresponding OLED pixel driving circuit, and the OLED pixel driving circuit comprises: a first switching element, a control terminal of the first switching element receives a first type of scanning signal (gn) of a present stage, a first channel terminal of the first switching element receives a data signal (Data), wherein, the data signal is a pulse signal formed by a reference voltage and a data voltage; a second switching element, a control terminal of the second switching element is connected with a second channel terminal of the first switching element through a first capacitor, a first channel terminal receives a power source voltage (VDD), wherein, a connection location between the second channel terminal of the first switching element and the first capacitor is defined as a first node, a connection location between the control terminal of the second switching element and the first capacitor is defined as a second node, and the power source voltage further connects to the second node through a second capacitor; a third switching element, a control terminal of the third switching element receives a lighting control signal (EM2), a first channel terminal of the third switching element is connected with a second channel terminal of the second switching element, a second channel terminal of the third switching element is connected to an organic electroluminescent device (OLED), wherein, a connection portion between the second channel terminal 23 of the second switching element and the first channel terminal of the third switching element is defined as a third node; a fourth switching element, a control terminal of the fourth switching element receives a second type of scanning signal of the present stage, a first channel terminal of the fourth switching element is connected to the third node, and a second channel terminal of the fourth switching element is connected to the second node; a fifth switching element, a control terminal of the fifth switching node receives a second type of scanning signal of the previous stage, a first channel terminal of the fifth switching node is connected with the second node, a second channel terminal of the fifth switching element receives a discharging voltage when the fifth switching element M5 is turned on; wherein, when lighting the organic electroluminescent device (OLED), a current flowing through the second switching element is proportional to a square of a difference between the data voltage and a reference voltage in the data signal.

The beneficial effect of the present invention is: comparing with the conventional art, the OLED pixel driving circuit provided by the present invention is a 5T2C structure, that is, a structure formed by five switching elements and two capacitors. Wherein, the second switching element is a switching element for driving the OLED. The OLED pixel driving circuit provided by the present invention can compensate the threshold voltage of the second switching element and the power source voltage such that when lighting the OLED, a current flowing through the second switching element is proportional to a square of a difference between the data voltage in the data signal and the reference voltage, and is unrelated to the threshold voltage Vth of the second switching element and the power source voltage such that a display brightness of the OLED is more even in order to improve the display quality.

DETAILED DESCRIPTION OF THE PREFERRED EMBODIMENT

The following will combine with drawings and embodiments for describing the present invention in detail.

Figure 1:
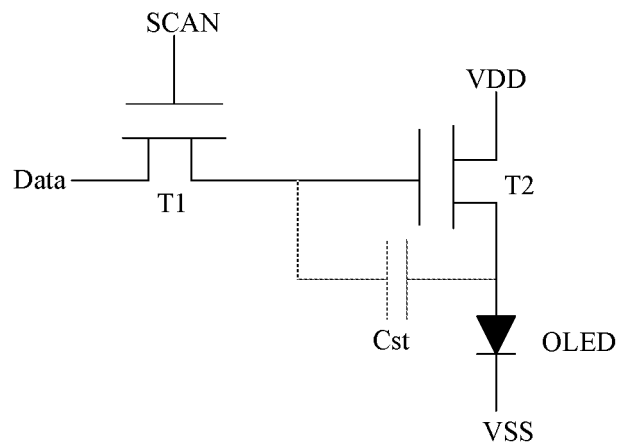
FIG. 1 is a schematic circuit diagram of a 2T1C pixel driving circuit applied in an OLED according to an embodiment of the conventional art.
Figure 2:
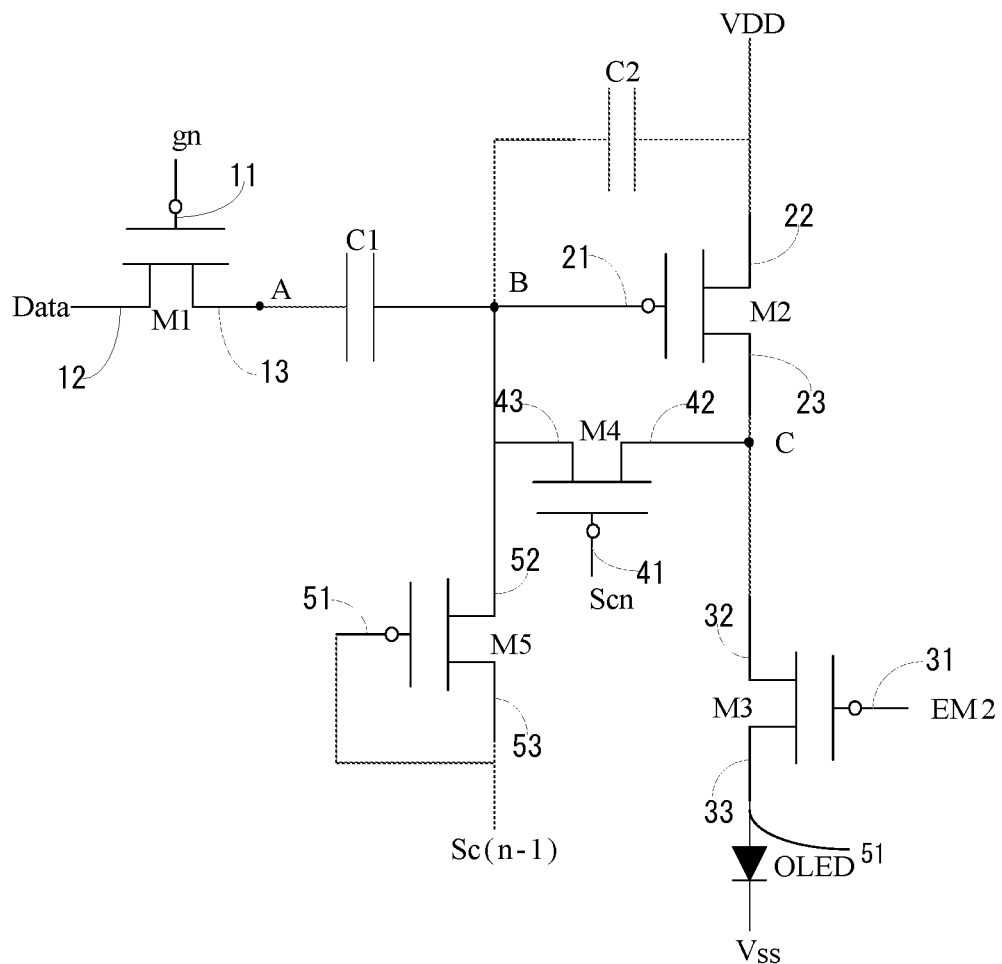
FIG. 2 is a schematic circuit diagram of an OLED pixel driving circuit according to an embodiment of the present invention.

With reference to FIG. 2, and FIG. 2 is a schematic circuit diagram of an OLED pixel driving circuit according to an embodiment of the present invention. The OLED pixel driving circuit includes: a first switching element M1, a second switching element M2, a third switching element M3, a fourth switching element M4, a fifth switching element M5, a first capacitor C1, a second capacitor C2 and an organic electroluminescent device (OLED). In the present embodiment, the first switching element M1, the second switching element M2, the third switching element M3, the fourth switching element M4, and the fifth switching element M5 are low temperature polysilicon thin film transistors, oxide semiconductor transistors or amorphous silicon thin film transistors. In one application field, as shown in FIG. 2, the first switching element M1, the second switching element M2, the third switching element M3, the fourth switching element M4, and the fifth switching element M5 are all PMOS transistors. In the following content, a control terminal of each switching element corresponds to a gate electrode of the PMOS transistor, a first channel terminal corresponds to a source electrode of the PMOS transistor, and a second channel terminal corresponds to a drain electrode of the PMOS transistor. In another embodiment, an NMOS transistor can be adopted according to an actual requirement, the present invention is not limited.

Specifically, for the first switching element M1, a control terminal 11 of the first switching element M1 receives a first type of scanning signal gn of a present stage. A first channel terminal 12 of the first switching element M1 receives a data signal Data. Wherein, the data signal is a pulse signal formed by a reference voltage Vref and a data voltage Vdata.

For the second switching element M2, a control terminal 21 of the second switching element M2 is connected with a second channel terminal 13 of the first switching element M1 through a first capacitor C1. A first channel terminal 22 receives a power source voltage VDD. Wherein, a connection location between the second channel terminal 13 of the first switching element M1 and the first capacitor C1 is defined as a first node A. A connection location between the control terminal 21 of the second switching element M2 and the first capacitor C1 is defined as a second node B, and the power source voltage VDD further connects to the second node B through a second capacitor C2.

For the third switching element M3, a control terminal 31 of the third switching element M3 receives a lighting control signal EM2, a first channel terminal 32 of the third switching element M3 is connected with a second channel terminal 23 of the second switching element M2, a second channel terminal 33 of the third switching element M3 is connected to an organic electroluminescent device (OLED). In the present embodiment, the second channel terminal 33 is connected to an anode 51 of the organic electroluminescent device (OLED). Wherein, a connection portion between the second channel terminal 23 of the second switching element M2 and the first channel terminal 32 of the third switching element M3 is defined as a third node C.

For the fourth switching element M4, a control terminal 41 of the fourth switching element M4 receives a second type of scanning signal Scn of the present stage. A first channel terminal 42 of the fourth switching element M4 is connected to the third node C, and a second channel terminal 43 of the fourth switching element M4 is connected to the second node B.

Figure 3:
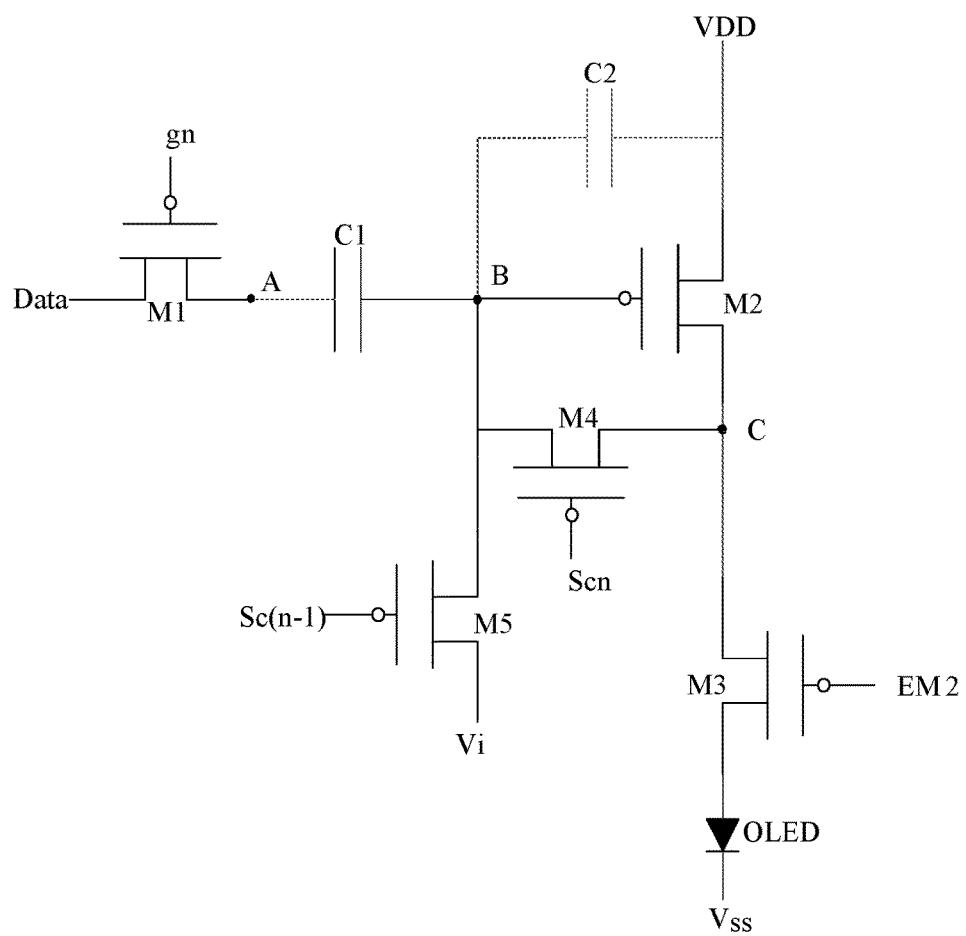
FIG. 3 is a schematic circuit diagram of an OLED pixel driving circuit according to another embodiment of the present invention.

For the fifth switching element M5, a control terminal 51 of the fifth switching node M5 receives a second type of scanning signal Sc(n−1) of the previous stage. The first channel terminal 52 of the fifth switching node M5 is connected with the second node B. A second channel terminal 53 of the fifth switching element M5 receives a discharging voltage when the fifth switching element M5 is turned on. In one embodiment, in order to avoid a difference of a threshold voltage of the fifth switching element M5 to cause different voltage levels at the second node B, the above discharging voltage can be a low voltage input signal Vi, as shown in FIG. 3.

Wherein, the above second element M2 is a driving switch element. When lighting the organic electroluminescent devices (OLED), a current flowing through the second switching element M2 is proportional to a square of a difference between the data voltage Vdata and a reference voltage Vref in the data signal Data.

The following will further deduce the above result in detail.

Figure 4:
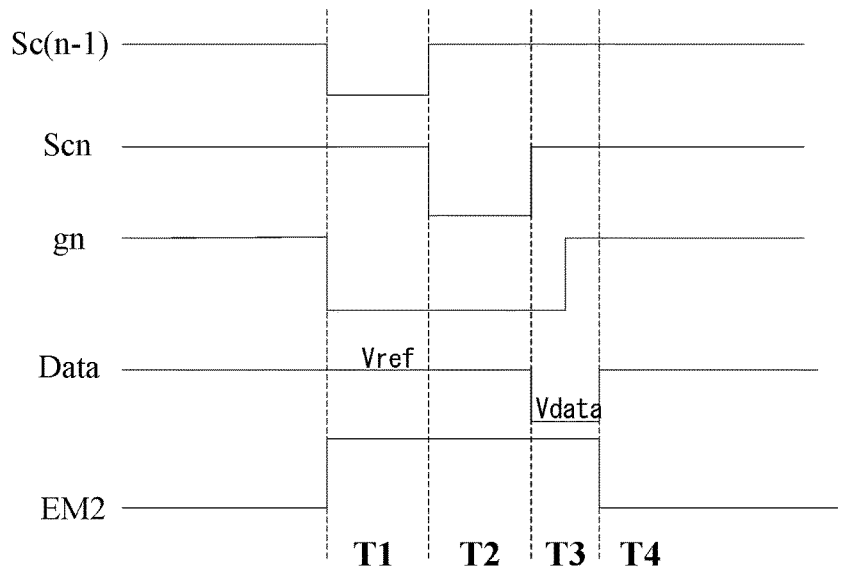
FIG. 4 is a schematic timing diagram of an OLED pixel driving circuit of the present invention.

With reference to FIG. 4, and FIG. 4 is a schematic timing diagram of an OLED pixel driving circuit of the present invention. Each of the second type of scanning signal Sc(n−1) of the previous stage, the second type of scanning signal Scn of the present stage, the first type of scanning signal gn of the present stage and the lighting control signal EM2 is a timing pulse signal. Wherein, in the present embodiment, the above timing pulse signal is a timing pulse signal formed by a high voltage level and a low voltage level. Low voltage levels of the second type of scanning signal Sc(n−1) of the previous stage, the second type of scanning signal Scn of the present stage, the first type of scanning signal gn of the present stage and the lighting control signal EM2 respectively correspond to pulses of the second type of scanning signal Sc(n−1) of the previous stage, the second type of scanning signal Scn of the present stage, the first type of scanning signal gn of the present stage and the lighting control signal EM2. The reference voltage Vref in the data signal Data is a high voltage level signal and the data voltage Vdata is a low voltage level signal.

Specifically, a pulse of the second type of scanning signal Sc(n−1) of the previous stage is earlier than the second type of scanning signal Scn of the present stage. A starting moment of a pulse of the first type of the scanning signal gn of the present stage is the same as a starting moment of the pulse of the second type of the scanning signal Sc(n−1) of the previously stage. An end moment of the pulse of the first scanning signal gn of the present stage is later then an end moment of the pulse of the second type of scanning signal Scn of the present stage. An starting moment of a pulse corresponding to the data voltage Vdata in the data signal Data is not earlier than an end moment of the pulse of the second type of scanning signal Scn, and is earlier an end moment of the pulse of the first type of scanning signal gn of the present stage. In the present embodiment, the starting moment of the pulse corresponding to the data voltage Vdata in the data signal Data is the same as the end moment of the pulse of the second type of scanning signal Scn of the present stage, but can be different in another embodiment;

An end moment of the pulse corresponding to the data voltage Vdata in the data signal Data is later than the end moment of the pulse of the first type of scanning signal gn of the present stage. A starting moment of the pulse of the lighting control signal EM2 is not later than the start moment of the second type of the scanning signal Sc(n−1) of the previous stage, and an end moment of the pulse of the lighting control signal EM2 is not earlier than the end moment of the pulse corresponding to the data voltage Vdata in the data signal Data. In the present embodiment, the starting moment of the pulse of the lighting control signal EM2 is the same as the starting moment of the second type of scanning signal Sc(n−1) of the previous stage, and an end moment of the pulse of the lighting control signal EM2 is the same as the end moment of the pulse corresponding to the data voltage Vdata in the data signal Data. In another embodiment, the above relationship can be different.

According to the description of the second type of scanning signal Sc(n−1) of the previous stage, the second type of scanning signal Scn of the present stage, the first type of scanning signal gn of the present stage, the data signal Data and the lighting control signal EM2, operation stages of the OLED pixel driving circuit in the present invention includes a first stage T1, a second stage T2, a third stage T3 and a fourth stage T4.

Specifically, in the first stage T1, with combined reference to FIG. 2 and FIG. 4, each of the second type of scanning signal Sc(n−1) of the previous stage and the first type of scanning signal gn of the present stage is at a pulse period having low voltage level. Each of the second type of scanning signal Scn of the present stage and the lighting control signal EM2 is at a non-pulse period having high voltage level. The data signal Data is inputted with a high voltage level of the reference voltage Vref. At this time, the third switching element M3 and the fourth switching element M4 are turned off. The first switching element M1, the second switching element M2 and the fifth switching element M5 are turned on.

The fifth switching element M5 performs a discharge for the second node B, the voltage level of node B is pulled down in order to erase data written by pervious frame image. The power source voltage VDD charges the third node C through the second switching element M2, but because the third switching element M3 and the fourth switching element M4 are turned off, the current path is cut off so that the voltage level of the third node C will be pulled up by the power source voltage VDD such that a continuous current will not be generated. In the first stage, the first type of scanning signal gn of the present stage is under a pulse period, the first switching element M1 will transmit the reference voltage Vref in the data signal Data to the first node A, that is, the voltage level VA1 of the first node A is Vref.

In the second stage T2, with combined reference to FIG. 2 and FIG. 4, each of the second type of scanning signal Scn of the present stage and the first type of scanning signal gn of the present stage is at a pulse period having low voltage level. Each of the second type of scanning signal Sc(n−1) of the previous stage and the lighting control signal EM2 is at a non-pulse period having high voltage level. The data signal Data is inputted with a high voltage level of the reference voltage Vref. At this time, the third switching element M3 and the fifth switching element M5 are turned off. The first switching element M1 and the fourth switching element M4 are turned on.

At this time, the voltage level VA2 of the first node A is still Vref. The fifth switching element M5 stops discharging the second node B. The power source voltage VDD charges the second node B through the second switching element M2, the third node C and the fourth switching element M4 such that the voltage level VB2 on the second node B is a sum of the power source voltage VDD and a threshold voltage Vth of the second switching element M2. That is, VB2=VDD+Vth. In the present embodiment, because the second switching element M2 is a PMOS transistor, the threshold voltage Vth is less than zero. Besides, after the voltage level of the node B reach VDD+Vth, the second switching element M2 is turned off.

In the third stage T3, with combined reference to FIG. 2 and FIG. 4, each of the second type of scanning signal Sc(n−1) of the previous stage and the lighting control signal EM2 is at a non-pulse period having high voltage level. Each of the first type of the scanning signal gn of the present stage is hopped to a non-pulse period having high voltage level from a pulse period having low voltage level. The data signal Data inputs a data voltage Vdata having a low voltage level. At this time, the third switching element M3, the fourth switching element M4 and the fifth switching element M5 are turned off. The first switching element M1 hopped to be turned off from a conductive state. The voltage level VA3 of the first node A is hopped to Vdata from the reference voltage Vref. A hopping value of the voltage of the first node A is ΔVA=Vdata−Vref; the voltage level on the second node B is hopped to VB3 along with the voltage hoping at the node A.

VB3=(Vdata−Vref)β+Vth+VDD, wherein, β=C1/(C1+C2), β is a voltage level hopping coefficient. C1 is a capacitance of the first capacitor, C2 is a capacitance of the second capacitor. At this time, the second switching element M2 is turned on.

In the fourth stage T4, the organic electroluminescent device (OLED) is under a driving-emitting stage. With combined reference to FIG. 2 and FIG. 4, each of the second type of scanning signal Sc(n−1) of the previous stage, the second type of scanning signal Scn of the present stage, the first type of scanning signal gn of the present stage is at a non-pulse period having high voltage level. The lighting control signal EM2 is at a pulse-period having a low voltage level. The data signal Data inputs a high voltage level of the reference voltage Vref. At this time, the first switching element M1 of the present stage, the fourth switching element M4 and the fifth switching element M5 are turned off. The power source voltage VDD drives the organic electroluminescent device (OLED) to emit light through the second switching element M2 and the third switching element M3 which are conductive. Wherein, in the fourth stage T4, a current I M2 flowing through the second switching element M2 is proportional to a square of a difference between the data voltage Vdata in the data signal Data and the reference voltage Vref. Specifically: at this time $$I_{OLED} = IM2 = k(Vgs - Vth)^2$$

$$= k(Vg - Vs - Vth)^2$$

$$= k(VB3 - VDD - Vth)^2$$

$$= k((Vdata - Vref)\beta + Vth + VDD - VDD - Vth)^2$$

$$= k((Vdata - Vref)\beta)^2$$

Wherein, the above IOLED is a current flowing through organic electroluminescent device (OLED), $I_{M2}$ is a current flowing through the second switching element M2, k is a current amplification factor of the second switching element M2 (k is decided by the property of the second switching element itself). Vgs is a voltage difference of the gate electrode and the source electrode of the second switching element M2. Vth is a threshold voltage of the second switching element. Vg is a voltage level of the gate electrode of the second switching element M2, that is, a voltage level of the control terminal and a voltage level of the second node B. Vs is a voltage level of the source electrode of the second switching element M2, that is a voltage level of the first channel terminal, and a power source voltage VDD. From the above deduction result, in the stage T4, that is, the organic electroluminescent device (OLED) is under a driving-emitting stage, the current is unrelated to the threshold voltage Vth of the second switching element M2 and the power source voltage VDD.

Figure 5:
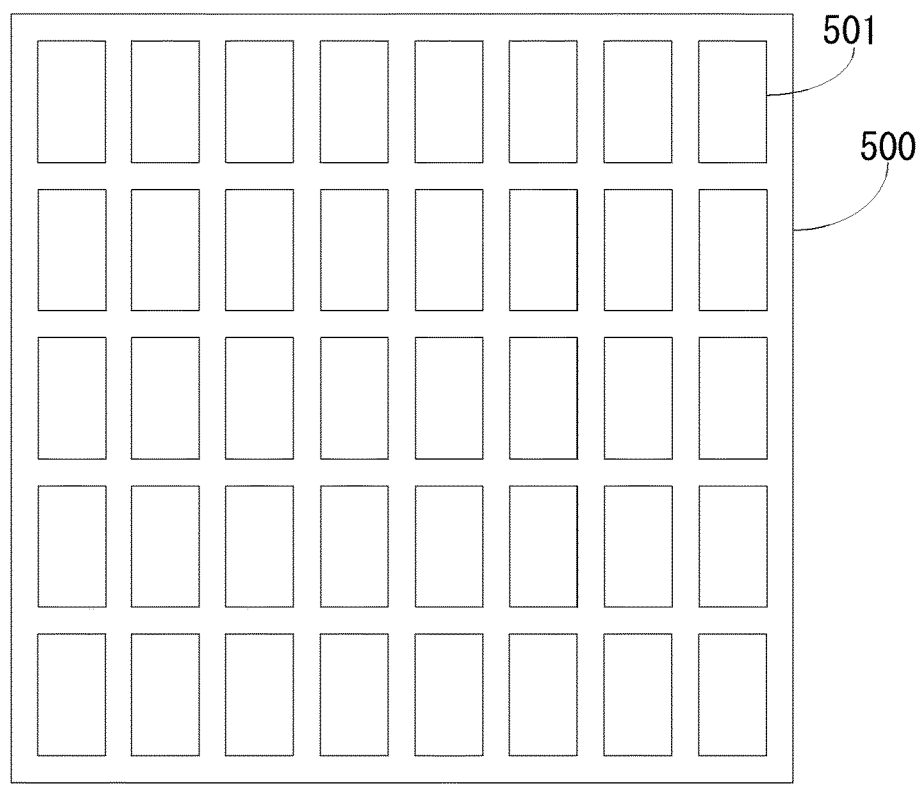
FIG. 5 is a schematic structure diagram of an OLED display device according to an embodiment of the present invention.

With reference to FIG. 5, and FIG. 5 is a schematic structure diagram of an OLED display device according to an embodiment of the present invention. The OLED display device 500 includes multiple OLED pixel units 501 arranged as a matrix (in FIG. 5, only one is schematically illustrated). Wherein, each OLED pixel unit 501 includes a corresponding OLED pixel driving circuit, and the circuit structure of each OLED pixel driving circuit is as described in the above embodiments, no more repeating.

In summary, comparing with the conventional art, the OLED pixel driving circuit provided by the present invention is a 5T2C structure, that is, a structure formed by five switching elements and two capacitors. Wherein the second switching element is a switching element for driving the OLED. The OLED pixel driving circuit provided by the present invention can compensate the threshold voltage of the second switching element and the power source voltage such that when lighting the OLED, a current flowing through the second switching element is proportional to a square of a difference between the data voltage in the data signal and the reference voltage, and is unrelated to the threshold voltage Vth of the second switching element and the power source voltage such that a display brightness of the OLED is more even in order to improve the display quality.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. An OLED pixel driving circuit, comprising:
   a first switching element, a control terminal of the first switching element receives a first type of scanning signal (gn) of a present stage, a first channel terminal of the first switching element receives a data signal (Data), wherein, the data signal is a pulse signal formed by a reference voltage and a data voltage;
   a second switching element, a control terminal of the second switching element is connected with a second channel terminal of the first switching element through a first capacitor, a first channel terminal receives a power source voltage (VDD), wherein, a connection location between the second channel terminal of the first switching element and the first capacitor is defined as a first node, a connection location between the control terminal of the second switching element and the first capacitor is defined as a second node, and the power source voltage further connects to the second node through a second capacitor;
   a third switching element, a control terminal of the third switching element receives a lighting control signal (EM2), a first channel terminal of the third switching element is connected with a second channel terminal of the second switching element, a second channel terminal of the third switching element is connected to an organic electroluminescent device (OLED), wherein, a connection portion between the second channel terminal 23 of the second switching element and the first channel terminal of the third switching element is defined as a third node;
   a fourth switching element, a control terminal of the fourth switching element receives a second type of scanning signal of the present stage, a first channel terminal of the fourth switching element is connected to the third node, and a second channel terminal of the fourth switching element is connected to the second node; and
   a fifth switching element, a control terminal of the fifth switching node receives a second type of scanning signal of the previous stage, a first channel terminal of the fifth switching node is connected with the second node, a second channel terminal of the fifth switching element receives a discharging voltage when the fifth switching element M5 is turned on;
   wherein, the first switching element, the second switching element, the third switching element, the fourth switching element, and the fifth switching element are all PMOS transistors; each of the second type of scanning signal of the previous stage, the second type of scanning signal of the present stage, the first type of scanning signal of the present stage and the lighting control signal is a timing pulse signal; wherein, a pulse of the second type of scanning signal of the previous stage is earlier than the second type of scanning signal of the present stage, a starting moment of a pulse of the first type of the scanning signal of the present stage is the same as a starting moment of the pulse of the second type of the scanning signal of the previously stage, an end moment of the pulse of the first scanning signal of the present stage is later then an end moment of the pulse of the second type of scanning signal of the present stage; an starting moment of a pulse corresponding to the data voltage in the data signal is not earlier than an end moment of the pulse of the second type of scanning signal, and is earlier an end moment of the pulse of the first type of scanning signal of the present stage; an end moment of the pulse corresponding to the data voltage in the data signal is later than the end moment of the pulse of the first type of scanning signal of the present stage; a starting moment of the pulse of the lighting control signal is not later than the start moment of the second type of the scanning signal of the previous stage, and an end moment of the pulse of the lighting control signal is not earlier than the end moment of the pulse corresponding to the data voltage in the data signal; and
   wherein, when lighting the organic electroluminescent device (OLED), a current flowing through the second switching element is proportional to a square of a difference between the data voltage and a reference voltage in the data signal.

2. The OLED pixel driving circuit according to claim 1, according to the second type of scanning signal of the previous stage, the second type of scanning signal of the present stage, the first type of scanning signal of the present stage, the data signal and the lighting control signal, operation stages of the OLED pixel driving circuit includes a first stage, a second stage, a third stage and a fourth stage;
   wherein, in the first stage, the second type of scanning signal of the previous stage is at a pulse period having low voltage level, the fifth switching element is turned on, the fifth switching element performs a discharge for the second node in order to erase data written by pervious frame image; at this time, the second switching element is turned on, the power source voltage charges the third node; in the first stage, the first type of scanning signal of the present stage is under a pulse period, the first switching element is turned on in order to transmit the reference voltage in the data signal to the first node;
   in the second stage, the second type of scanning signal of the previous stage is at a non-pulse period, the fifth switching element is turned off in order to discharge the second node; each of the second type of scanning signal of the present stage and the first type of scanning signal of the present stage is at a pulse period, the fourth switching element is turned on, the voltage on the third node charges the second node such that the voltage level on the second node is a sum of the power source voltage VDD and a threshold voltage Vth of the second switching element;

in the third stage, the data signal is hopped to the data voltage from the reference voltage, the voltage on the second node is hopped to (Vdata−Vref)β+Vth+VDD, wherein β=C1/(C1+C2), β is a voltage level hopping coefficient, C1 is a capacitance of the first capacitor, C2 is a capacitance of the second capacitor, and the second switching element is turned on; and in the fourth stage, the lighting control signal is at a pulse-period, the third switching element is turned on, the power source voltage drive the organic electroluminescent device to emit light through the second switching element and the third switching element which are conductive; wherein, in the fourth stage, a current flowing through the second switching element is proportional to a square of a difference between the data voltage in the data signal and the reference voltage.

3. The OLED pixel driving circuit according to claim 1, wherein, each of the second type of scanning signal of the previous stage, the second type of scanning signal of the present stage, the first type of scanning signal of the present stage and the lighting control signal is a timing pulse signal that is formed by a high voltage level and a low voltage level; low voltage levels of the second type of scanning signal of the previous stage, the second type of scanning signal of the present stage, the first type of scanning signal of the present stage and the lighting control signal respectively correspond to pulses of the second type of scanning signal of the previous stage, the second type of scanning signal of the present stage, the first type of scanning signal of the present stage and the lighting control signal.

4. The OLED pixel driving circuit according to claim 3, wherein, the reference voltage in the data signal is a high voltage level signal and the data voltage is a low voltage level signal.

5. The OLED pixel driving circuit according to claim 1, wherein, the discharging voltage is the second type of scanning signal of the previous stage or a low voltage input signal.

6. An OLED pixel driving circuit, comprising:
a first switching element, a control terminal of the first switching element receives a first type of scanning signal (gn) of a present stage, a first channel terminal of the first switching element receives a data signal (Data), wherein, the data signal is a pulse signal formed by a reference voltage and a data voltage;
a second switching element, a control terminal of the second switching element is connected with a second channel terminal of the first switching element through a first capacitor, a first channel terminal receives a power source voltage (VDD), wherein, a connection location between the second channel terminal of the first switching element and the first capacitor is defined as a first node, a connection location between the control terminal of the second switching element and the first capacitor is defined as a second node, and the power source voltage further connects to the second node through a second capacitor;
a third switching element, a control terminal of the third switching element receives a lighting control signal (EM2), a first channel terminal of the third switching element is connected with a second channel terminal of the second switching element, a second channel terminal of the third switching element is connected to an organic electroluminescent device (OLED), wherein, a connection portion between the second channel terminal 23 of the second switching element and the first channel terminal of the third switching element is defined as a third node;
a fourth switching element, a control terminal of the fourth switching element receives a second type of scanning signal of the present stage, a first channel terminal of the fourth switching element is connected to the third node, and a second channel terminal of the fourth switching element is connected to the second node; and
a fifth switching element, a control terminal of the fifth switching node receives a second type of scanning signal of the previous stage, a first channel terminal of the fifth switching node is connected with the second node, a second channel terminal of the fifth switching element receives a discharging voltage when the fifth switching element M5 is turned on;
wherein, when lighting the organic electroluminescent device (OLED), a current flowing through the second switching element is proportional to a square of a difference between the data voltage and a reference voltage in the data signal.

7. The OLED pixel driving circuit according to claim 6, wherein, each of the second type of scanning signal of the previous stage, the second type of scanning signal of the present stage, the first type of scanning signal of the present stage and the lighting control signal is a timing pulse signal;
wherein, a pulse of the second type of scanning signal of the previous stage is earlier than the second type of scanning signal of the present stage, a starting moment of a pulse of the first type of the scanning signal of the present stage is the same as a starting moment of the pulse of the second type of the scanning signal of the previously stage, an end moment of the pulse of the first scanning signal of the present stage is later then an end moment of the pulse of the second type of scanning signal of the present stage; and
an starting moment of a pulse corresponding to the data voltage in the data signal is not earlier than an end moment of the pulse of the second type of scanning signal, and is earlier an end moment of the pulse of the first type of scanning signal of the present stage; an end moment of the pulse corresponding to the data voltage in the data signal is later than the end moment of the pulse of the first type of scanning signal of the present stage; a starting moment of the pulse of the lighting control signal is not later than the start moment of the second type of the scanning signal of the previous stage, and an end moment of the pulse of the lighting control signal is not earlier than the end moment of the pulse corresponding to the data voltage in the data signal.

8. The OLED pixel driving circuit according to claim 7, wherein, according to the second type of scanning signal of the previous stage, the second type of scanning signal of the present stage, the first type of scanning signal of the present stage, the data signal and the lighting control signal, operation stages of the OLED pixel driving circuit includes a first stage, a second stage, a third stage and a fourth stage;
wherein, in the first stage, the second type of scanning signal of the previous stage is at a pulse period having low voltage level, the fifth switching element is turned on, the fifth switching element performs a discharge for the second node in order to erase data written by pervious frame image; at this time, the second switching element is turned on, the power source voltage charges the third node; in the first stage, the first type of scanning signal of the present stage is under a pulse period, the first switching element is turned on in order to transmit the reference voltage in the data signal to the first node;

in the second stage, the second type of scanning signal of the previous stage is at a non-pulse period, the fifth switching element is turned off in order to discharge the second node; each of the second type of scanning signal of the present stage and the first type of scanning signal of the present stage is at a pulse period, the fourth switching element is turned on, the voltage on the third node charges the second node such that the voltage level on the second node is a sum of the power source voltage VDD and a threshold voltage Vth of the second switching element;

in the third stage, the data signal is hopped to the data voltage from the reference voltage, the voltage on the second node is hopped to (Vdata−Vref)β+Vth+VDD, wherein β=C1/(C1+C2), β is a voltage level hopping coefficient, C1 is a capacitance of the first capacitor, C2 is a capacitance of the second capacitor, and the second switching element is turned on; and in the fourth stage, the lighting control signal is at a pulse-period, the third switching element is turned on, the power source voltage drive the organic electroluminescent device to emit light through the second switching element and the third switching element which are conductive; wherein, in the fourth stage, a current flowing through the second switching element is proportional to a square of a difference between the data voltage in the data signal and the reference voltage.

9. The OLED pixel driving circuit according to claim 6, wherein, the first switching element, the second switching element, the third switching element, the fourth switching element, and the fifth switching element are all PMOS transistors.

10. The OLED pixel driving circuit according to claim 9, wherein, each of the second type of scanning signal of the previous stage, the second type of scanning signal of the present stage, the first type of scanning signal of the present stage and the lighting control signal is a timing pulse signal that is formed by a high voltage level and a low voltage level; low voltage levels of the second type of scanning signal of the previous stage, the second type of scanning signal of the present stage, the first type of scanning signal of the present stage and the lighting control signal respectively correspond to pulses of the second type of scanning signal of the previous stage, the second type of scanning signal of the present stage, the first type of scanning signal of the present stage and the lighting control signal.

11. The OLED pixel driving circuit according to claim 10, wherein, the reference voltage in the data signal is a high voltage level signal and the data voltage is a low voltage level signal.

12. The OLED pixel driving circuit according to claim 6, wherein, the discharging voltage is the second type of scanning signal of the previous stage or a low voltage input signal.

13. An OLED display device including multiple OLED pixel unit arranged as a matrix, wherein, each OLED pixel unit includes a corresponding OLED pixel driving circuit, and the OLED pixel driving circuit comprises:

a first switching element, a control terminal of the first switching element receives a first type of scanning signal (gn) of a present stage, a first channel terminal of the first switching element receives a data signal (Data), wherein, the data signal is a pulse signal formed by a reference voltage and a data voltage;

a second switching element, a control terminal of the second switching element is connected with a second channel terminal of the first switching element through a first capacitor, a first channel terminal receives a power source voltage (VDD), wherein, a connection location between the second channel terminal of the first switching element and the first capacitor is defined as a first node, a connection location between the control terminal of the second switching element and the first capacitor is defined as a second node, and the power source voltage further connects to the second node through a second capacitor;

a third switching element, a control terminal of the third switching element receives a lighting control signal (EM2), a first channel terminal of the third switching element is connected with a second channel terminal of the second switching element, a second channel terminal of the third switching element is connected to an organic electroluminescent device (OLED), wherein, a connection portion between the second channel terminal of the second switching element and the first channel terminal of the third switching element is defined as a third node;

a fourth switching element, a control terminal of the fourth switching element receives a second type of scanning signal of the present stage, a first channel terminal of the fourth switching element is connected to the third node, and a second channel terminal of the fourth switching element is connected to the second node; and a fifth switching element, a control terminal of the fifth switching node receives a second type of scanning signal of the previous stage, a first channel terminal of the fifth switching node is connected with the second node, a second channel terminal of the fifth switching element receives a discharging voltage when the fifth switching element M5 is turned on;

wherein, when lighting the organic electroluminescent device (OLED), a current flowing through the second switching element is proportional to a square of a difference between the data voltage and a reference voltage in the data signal.

14. The OLED display device according to claim 13, wherein, each of the second type of scanning signal of the previous stage, the second type of scanning signal of the present stage, the first type of scanning signal of the present stage and the lighting control signal is a timing pulse signal;

wherein, a pulse of the second type of scanning signal of the previous stage is earlier than the second type of scanning signal of the present stage, a starting moment of a pulse of the first type of the scanning signal of the present stage is the same as a starting moment of the pulse of the second type of the scanning signal of the previously stage, an end moment of the pulse of the first scanning signal of the present stage is later then an end moment of the pulse of the second type of scanning signal of the present stage;

an starting moment of a pulse corresponding to the data voltage in the data signal is not earlier than an end moment of the pulse of the second type of scanning signal, and is earlier an end moment of the pulse of the first type of scanning signal of the present stage; an end moment of the pulse corresponding to the data voltage in the data signal is later than the end moment of the pulse of the first type of scanning signal of the present stage; a starting moment of the pulse of the lighting control signal is not later than the start moment of the second type of the scanning signal of the previous stage, and an end moment of the pulse of the lighting control signal is not earlier than the end moment of the pulse corresponding to the data voltage in the data signal.

15. The OLED display device according to claim 14, wherein, according to the second type of scanning signal of the previous stage, the second type of scanning signal of the present stage, the first type of scanning signal of the present stage, the data signal and the lighting control signal, operation stages of the OLED pixel driving circuit includes a first stage, a second stage, a third stage and a fourth stage;

wherein, in the first stage, the second type of scanning signal of the previous stage is at a pulse period having low voltage level, the fifth switching element is turned on, the fifth switching element performs a discharge for the second node in order to erase data written by pervious frame image; at this time, the second switching element is turned on, the power source voltage charges the third node; in the first stage, the first type of scanning signal of the present stage is under a pulse period, the first switching element is turned on in order to transmit the reference voltage in the data signal to the first node;

in the second stage, the second type of scanning signal of the previous stage is at a non-pulse period, the fifth switching element is turned off in order to discharge the second node; each of the second type of scanning signal of the present stage and the first type of scanning signal of the present stage is at a pulse period, the fourth switching element is turned on, the voltage on the third node charges the second node such that the voltage level on the second node is a sum of the power source voltage VDD and a threshold voltage Vth of the second switching element;

in the third stage, the data signal is hopped to the data voltage from the reference voltage, the voltage on the second node is hopped to (Vdata−Vref)β+Vth+VDD, wherein β=C1/(C1+C2), β is a voltage level hopping coefficient, C1 is a capacitance of the first capacitor, C2 is a capacitance of the second capacitor, and the second switching element is turned on; and in the fourth stage, the lighting control signal is at a pulse-period, the third switching element is turned on, the power source voltage drive the organic electroluminescent device to emit light through the second switching element and the third switching element which are conductive; wherein, in the fourth stage, a current flowing through the second switching element is proportional to a square of a difference between the data voltage in the data signal and the reference voltage.

16. The OLED display device according to claim 13, wherein, the first switching element, the second switching element, the third switching element, the fourth switching element, and the fifth switching element are all PMOS transistors.

17. The OLED display device according to claim 16, wherein, each of the second type of scanning signal of the previous stage, the second type of scanning signal of the present stage, the first type of scanning signal of the present stage and the lighting control signal is a timing pulse signal that is formed by a high voltage level and a low voltage level; low voltage levels of the second type of scanning signal of the previous stage, the second type of scanning signal of the present stage, the first type of scanning signal of the present stage and the lighting control signal respectively correspond to pulses of the second type of scanning signal of the previous stage, the second type of scanning signal of the present stage, the first type of scanning signal of the present stage and the lighting control signal.

18. The OLED display device according to claim 17, wherein, the reference voltage in the data signal is a high voltage level signal and the data voltage is a low voltage level signal.

19. The OLED display device according to claim 13, wherein, the discharging voltage is the second type of scanning signal of the previous stage or a low voltage input signal.

* * * * *